United States Patent [19]

Lee

[11] Patent Number: 5,276,642

[45] Date of Patent: Jan. 4, 1994

[54] METHOD FOR PERFORMING A SPLIT READ/WRITE OPERATION IN A DYNAMIC RANDOM ACCESS MEMORY

[75] Inventor: Terry R. Lee, Boise, Id.

[73] Assignee: Micron Technology, Inc., Boise, Id.

[21] Appl. No.: 730,366

[22] Filed: Jul. 15, 1991

[51] Int. Cl.⁵ .............................................. G11C 7/00
[52] U.S. Cl. ............................ 365/189.04; 365/222
[58] Field of Search ............. 365/189.01, 189.04, 365/220, 222

[56] References Cited

U.S. PATENT DOCUMENTS

| | | | |
|---|---|---|---|
| 4,541,090 | 9/1985 | Shiragasawa | 365/201 X |
| 4,725,987 | 2/1988 | Cates | 365/189.04 X |
| 5,042,013 | 8/1991 | Sato | 365/189.04 X |

*Primary Examiner*—Steven Mottola
*Attorney, Agent, or Firm*—Susan B. Collier

[57] ABSTRACT

The invention is a method for implementing a split read/write operation in a multiple write enable dynamic random access memory device. A split read/write operation is an operation where the data in at least one bank is read while the data is being written to at least one remaining bank, all banks accessed by the same address. The method of the invention also implements writes and reads to all of the banks, a write to at least one bank, and a read to at least one bank. In instances where all of the banks are not written, the banks not being written are refreshed; and in instances where all of the banks are not being read, the banks not being read are masked for a write. The invention also provides individual masking of selected memory arrays in both write and read operations.

19 Claims, 10 Drawing Sheets

| MASKING CAPABILITIES | TABULAR INSTRUCTIONS | | | | $\overline{RAS}$ ACTIVE PRECEDING TABULAR INSTRUCTIONS AND $\overline{CAS}$ ACTIVE SUBSEQUENT TO TABULAR INSTRUCTIONS |
|---|---|---|---|---|---|
| WHEN MASK WRITE ENABLED BY $\overline{WE}$ ACTIVE FOR MASKED BANK BEFORE $\overline{RAS}$ ACTIVE | $\overline{WEL}$ | $\overline{WEH}$ | $\overline{OE}$ | | |
| NO MASKING | 1 | 1 | 0 | | WORD READ |
| MASKING OF SELECTED DQS IN EACH BANK | 0 | 0 | X | | WORD WRITE |
| MASKING OF SELECTED DQS IN LOWER BANK | 0 | 1 | 1 | | (BYTE) WRITE LOWER BANK |
| MASKING OF SELECTED DQS IN UPPER BANK | 1 | 0 | 1 | | (BYTE) WRITE UPPER BANK |
| MASKING OF SELECTED DQS IN LOWER BANK | 0 | 1 | 0 | | (SPLIT) WRITE LOWER BANK READ UPPER BANK |
| MASKING OF SELECTED DQS IN UPPER BANK | 1 | 0 | 0 | | (SPLIT) WRITE UPPER BANK READ LOWER BANK |
| MASK WRITE OF ENTIRE LOWER BANK | 0 | 1 | 0 | | (BYTE) READ UPPER BANK |
| MASK WRITE OF ENTIRE UPPER BANK | 1 | 0 | 0 | | (BYTE) READ LOWER BANK |

FIG. 7

METHOD FOR PERFORMING A SPLIT READ/WRITE OPERATION IN A DYNAMIC RANDOM ACCESS MEMORY

FIELD OF THE INVENTION

This invention relates to computer memories and more particularly to a dynamic random access memory (DRAM) device having the capability to perform read and write operations from and to a given address.

BACKGROUND OF THE INVENTION

The dynamic random access memory (DRAM) device 1 represented by the diagram of FIG. 1 stores digital information or data in an arrangement of memory cells 3. An arrangement of memory cells is called an array. The cells 3 are arranged in the array in a configuration of intersecting rows 5 and columns 6. The rows 5 are also referred to as wordlines 5. Each memory cell comprises a storage capacitor (not shown) capable of holding a charge and a metal-oxide semiconductor field effect transistor (MOSFET) (not shown) for accessing the capacitor charge; hereinafter this transistor is referred to as an access transistor. The charge is a voltage potential referred to as a data bit and is typified as either a high voltage or a low voltage. Therefore, the memory has two states; often thought of as the true logic state and the complementary logic state. The data bit is amplified and latched to the digit lines 7 by sense amplifier 8.

There are two options available in a DRAM memory; a bit of data may be stored in a specific cell in the write mode, or a bit of data may be retrieved from a specific cell in the read mode. The data is either transferred from the digit lines 7 to Input/Output lines (I/O) 9 in the read mode: or transferred from the I/O lines 9 to the digit lines 7 in the write mode. In either case, the data is transferred through MOSFETs 10 used as switching devices and called decode transistors. For each bit of data stored, its true logic state is available at a first I/O line 11 and its complementary logic state is available at a second I/O line 13, designated I/O complement. For purposes of this discussion, I/O and I/O complement lines are often referred to as just I/O lines 9. Although each cell 3 is only connected to one digit line 7 through an activated access transistor, each cell 3 is electrically referenced to two digit lines 7, referred to as a digit line pair 15, through the sense amplifiers 8. The digit line pair 15 comprises the "digit line" 17 for coupling true data and the "digit bar line" 19 for coupling complementary data. Typically, the digit line 17 is referred to as digit and the digit bar line 19 is referred to as digit bar. The digit line pair 15 couples the true and complementary data between the selected cell 3 and the I/O lines In order to read from or write to a cell 3, the particular cell 3 in question must be selected or sometimes referred to as "addressed." A particular cell 3 is selected when the row decoder 21 activates a wordline 5 and the column decoder 23 activates a column 6. The electrical intersection of the activated wordline 5 and activated column 6 determines which cell 3 has been selected.

A supply potential $V_{cc}$ and a ground reference potential are available to the circuitry of the memory device. Between cycles of cell selection it is necessary to equilibrate the digit lines of each digit line pair 15 in a memory array to the same voltage, usually $V_{cc}/2$. This equilibration of the digit lines is often referred to as the precharge cycle. Equilibrate circuitry (not shown) parallel with the sense amplifier essentially shorts the digit lines together and holds them at $V_{cc}/2$. This equilibration is necessary so that the digit lines 7 are ready to receive data during the next cycle.

The I/O lines also equilibrate between cycles of cell selection by circuitry configured in parallel with the I/O and I/O complement. $3/5 V_{cc}$ is typically the equilibrate voltage of the I/O lines.

In order to facilitate an understanding of the present invention, pertinent aspects of a typical write operation to a single cell are explained below with reference to FIG. 2. FIG. 2 more fully depicts the circuitry relevant to two digit line pairs 15A and 15B of the digit line pairs 15 shown in FIG. 1. The numbers pertinent to components in FIG. 1 are relevant to similar components in FIG. 2.

Digits 17A and 17B are connected to memory cells 3A and 3B respectively and are accessed through row 5A. Digit bars 19A and 19B are connected to memory cells 3C and 3D respectively and are accessed through row 5B. Therefore, memory cells 3A and 3B store data in true form and memory cells 3C and 3D store data in complementary or inverse form. The p sense amplifiers 8A and 8B and the n sense amplifiers 8C and 8D latch data on the digit line pairs 15A and 15B respectively during read and write operations.

During standby switching transistors 24 comprising the pull up p-type MOSFETs (p switching transistors) 25 and the pull down n-type MOSFET (n switching transistor) 26 are off and the data remains stored in cells 3A through 3D. During a write or read operation all of the p 25 and n 26 transistors are actuated. The p switching transistors 25 are actuated by a low signal applied to their gates. Once actuated, the p switching transistors 25 couple the supply voltage $V_{cc}$ 27 to the circuit. The n switching transistor 24 is actuated by a high signal applied to its gate 26. Once actuated, the n switching transistor 24 couples the ground reference potential 28 to the circuit.

For example, assume cell 3A is selected for a write operation. An active output from the row decoder activates wordline 5A. The active wordline 5A actuates the cells' 3A and 3B access transistors 29A and 29B pertinent to wordline 5A, while access transistors 29C and 29D pertinent to inactive wordline 5B remain deactivated. The switching transistors 24 are actuated and digit 17A is latched to the true data stored in cell 3A while digit bar 19A is latched to the complement of the true data. Similarly, digit 17B is latched to the true data stored in cell 3B while digit bar 19B is latched to the complement of the true data. Next the column decoder activates column 6A which in turn actuates decode transistors 10A. Column 6B remains inactive since it was not activated by the column decoder. Consequently decode transistors 10B remain off. In a write mode the input data is coupled through the actuated decode transistors 10A from the I/O lines 9 to the digit line pair 15A where the input data overwrites the data previously latched to digit line pair 15A. The data on digit line pair 15B is not disturbed since decode transistors 10B are off.

FIG. 3 is a portion of a DRAM 41 having a memory 43 comprising 16 individual memory arrays similar to memory array 45. Each array comprises 256K (K=1024) memory cells. Each memory cell stores a bit of digital information. In this case, the array is capable of storing 256 kilobits (262,144 bits). For any given address location a corresponding cell on each individual array is selected. Corresponding to each array is a DQ pin (not shown) in electrical communication with its respective array for accepting the bit of digital information from sources external to the DRAM in a write operation and from the internal memory cells in a read operation. In this discussion the designation DQ refers to a DQ pin and the ensuing subscript references the array to which the DQ pin corresponds. For example, digital information written to the fourth array is available at $DQ_4$, and digital information read from the seventh memory array is available at $DQ_7$.

Sixteen bits of information is called a word, and a memory cell is selected in each array to comprise the word. Eight bits of information comprises a byte. Typically, memory arrays 1 through 8 and memory arrays 9 through 16 comprise a byte.

Instructions, comprising an output enable ($\overline{OE}$) signal and a write enable ($\overline{WE}$) signal, generated in a central processing unit (CPU) control the read and write operations of a typical DRAM. (Throughout this discussion designations $\overline{OE}$ and $\overline{WE}$ will be considered the $\overline{OE}$ and $\overline{WE}$ signals unless stated otherwise, another option being the physical $\overline{OE}$ and $\overline{WE}$ outputs.) The active and inactive logic states of the $\overline{OE}$ and $\overline{WE}$ instructions determine whether data is written to or read from a memory cell. In order to read data from a memory cell, $\overline{OE}$ needs to be in an active logic state and $\overline{WE}$ needs to be in an inactive logic state. In order to write data into a memory cell, $\overline{WE}$ needs to be in an active logic state and $\overline{OE}$ needs to be in an inactive logic state. Both the read and write operations are preceded by an active row address strobe ($\overline{RAS}$) signal and also require an active column address strobe ($\overline{CAS}$) signal. In typical DRAMs, the $\overline{WE}$ and the $\overline{OE}$ are not activated at the same time. This is because the data ports are shared for input and output data. The DRAM logic inhibits the condition of both the $\overline{OE}$ and $\overline{WE}$ signals active at the same time by either not allowing it or by disabling the DRAM's ability to drive data to the output.

FIG. 4 is a timing diagram depicting the logic states of the $\overline{OE}$ and $\overline{WE}$ for typical read and write operations. Both operations require an active $\overline{RAS}$ signal 46 preceding an active $\overline{CAS}$ signal 47. OE 48 and WE 49 are active low signals, therefore when $\overline{OE}$ 48 is asserted low at point 51 the data 52 is read from the memory cell, and when $\overline{WE}$ 49 is asserted low at point 53 the data 52 is written to the memory cell.

The DRAM arrays can be thought of as being arranged in two banks. In the case of a 16 memory array device, a first or lower bank comprising memory arrays 1 through 8 and a second or upper bank comprising memory arrays 9 through 16.

The references contained herein to "upper" and "lower" banks of memory arrays, to corresponding "upper" and "lower" data ports, and to corresponding control signals are not intended to specify physical location, but are merely a reference to separate groups of these arrays, data ports, and control signals, as is understood by those skilled in the art.

Wide word DRAMs are characterized as a DRAM device having eight or more output bits. Some wide word DRAMs have either two $\overline{WE}$ signals or two $\overline{CAS}$ signals for byte control. The first device allows writes to one bank, byte write; or writes to both banks, word writes. The latter device allows reads or writes to one bank, byte reads and byte writes respectively; or reads or writes to both banks, word reads and word writes respectively.

Micron Technology, Inc. is developing a 256K by 16 DRAM device (16 memory arrays each containing 256K memory cells) having either two $\overline{WE}$ signal inputs or two $\overline{CAS}$ signal inputs. In both cases the two inputs drive NOR NAND logic internal to the DRAM device. The two $\overline{WE}$ input device is utilized to provide a word write or byte writes. The two $\overline{CAS}$ input device is utilized to provide a word write, byte writes, a word read, or byte reads. Neither device, as currently conceived, provides a split read/write operation, an operation where the data in one bank is read while the data is being written to the remaining bank, both banks accessed by the same address.

The 1991 Micron Technology, Inc. MOS Data Book provides a complete description of the two $\overline{WE}$ (MT4C16256/8) and two $\overline{CAS}$ (MT4C16257/9) devices being developed by Micron Technology, Inc.

SUMMARY OF THE INVENTION

The preferred embodiment of the invention is a method for implementing a split read/write operation in a two $\overline{WE}$, designated $\overline{WEH}$ and $\overline{WEL}$, DRAM device. A split read/write operation is an operation where the data in one bank is read while the data is being written to the remaining bank, both banks accessed by the same address. The method of the preferred embodiment also implements word writes, word reads, a byte write to only one bank, and a byte read of only one bank.

A data mask register can be loaded with an appropriate value to disable the write to one of the banks; all eight bits are masked. Disabling the write of one bit is called masking the bit, also referred to as a mask write. While one bank is disabled the opposite bank of the chip is read resulting in only a byte read from one bank. This implementation was not previously possible for a two $\overline{WE}$ device.

The preferred embodiment also provides individual masking of selected memory arrays in both word writes or byte writes.

Even though the method allows byte reads and split read/write operations, the pin configuration and data ports remain the same as current wide word DRAMs, reducing the number of circuit connections when the DRAM is in electrical communication with a circuit board.

The method allows one of the two $\overline{WE}$ and the $\overline{OE}$ to have simultaneous active logic states for enabling the split read/write cycle. The bank which has $\overline{WE}$ (either $\overline{WEH}$ or $\overline{WEL}$) active is capable of performing a write cycle while the bank with the remaining $\overline{WE}$ nonactivated is capable of performing a read cycle at the same address location when $\overline{OE}$ is activated. Therefore, when one of the $\overline{WE}$ signals is active, the $\overline{OE}$ signal controls the opposite bank for a read cycle. The invention of the preferred embodiment is accomplished utilizing the conventional pin configuration of a wide word two $\overline{WE}$ device. Since this invention utilizes a previously unused input signal logic state, it operates identically to conventional two $\overline{WE}$ DRAMs in all other modes, and it would function correctly in applications where a conventional two $\overline{WE}$ DRAM is used.

FIG. 5 is an example showing how a 1005 element delay FIFO (first in, first out) is implemented using the split read/write mode. In the FIFO implementation of the example the first 1005 data bytes are written in byte write mode to one of the banks, in this case bank 55.

Although this example shows the write performed sequentially, this is not necessary. After the 1005th data word is written, the address is reset to the beginning, and the following cycles are split read/write cycles where the first bank 55 is read while the second bank 57 is written. In the first split read/write cycle of the example, bank 55 is read starting with data in byte 1 and continuing though byte 1005, while bank 57 is written starting with byte 1006 and continuing though byte 2010. During the second split read/write cycle, bytes 1006 through 2010 in bank 57 are read sequentially while new data is written sequentially to bytes 1 through 1005 in bank 55. This pattern of split read/writes, where the simultaneous read and Write cycles alternate continually between the two banks, perpetuates a continuous 1005 element delay.

This device can be used to replace two typical DRAM devices of the prior art with one DRAM device of the present invention to function as a double buffer or frame memory. In this type of system, data is written to one memory device while data is read from the other memory device allowing continuous data storage and continuous and simultaneous data retrieval.

This device can also be used in a dual processor system having a shared memory for communicating between the processors. It can also be used for special graphics functions such as digital television and frame buffers for television and communication systems.

BRIEF DESCRIPTION OF THE DRAWINGS

FIGS. 7 is a table listing the operations of the preferred embodiment and the conditions of the control signals necessary to implement the operations, including masking options.

FIG. 9 depicts control signals effecting a split read/write operation.

FIG. 10 depicts control signals effecting a word write and a word read.

FIG. 11 depicts control signals effecting a mask write in both banks and effecting the masking of one bank in its entirety while the opposite bank is read.

DETAILED DESCRIPTION OF THE INVENTION

The preferred embodiment is two $\overline{WE}$ input designated $\overline{WEL}$ and $\overline{WEH}$, dynamic random access memory (DRAM) having circuitry providing a split read/write, a simultaneous read of one bank of an address while writing to the remaining bank of the same address. The preferred embodiment also comprises word write, word read, a byte write only, a byte read only, and mask writes of individual DQs.

Figure 6B:
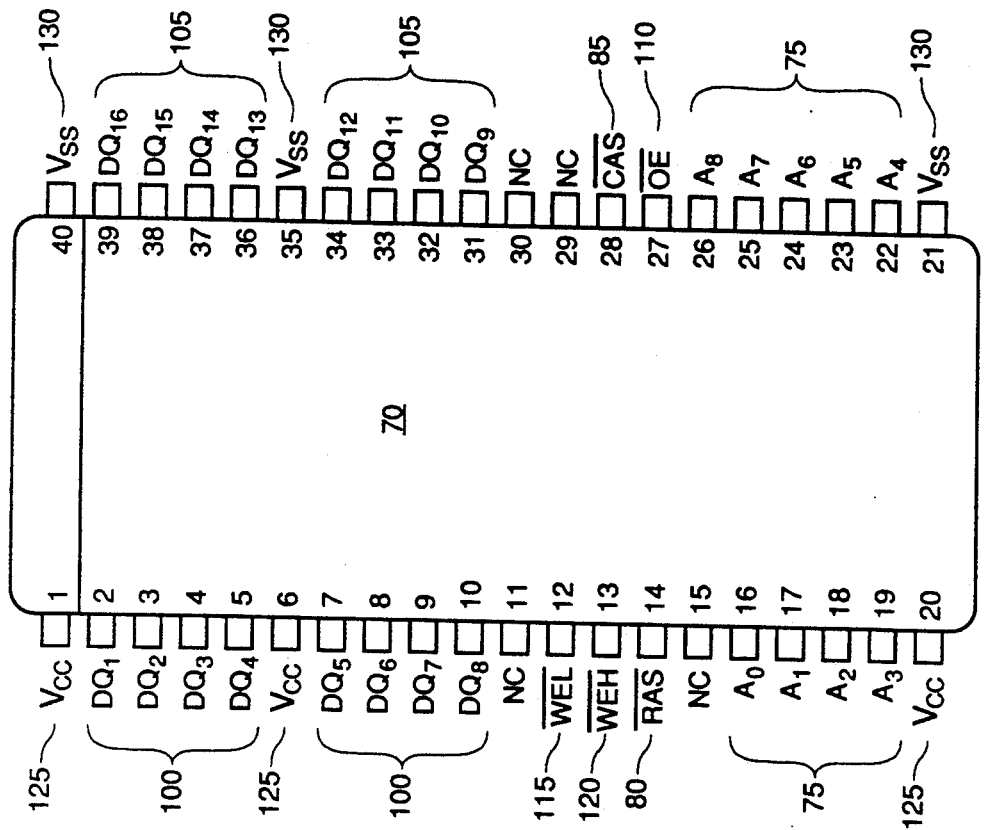
FIG. 6B shows the typical pin configuration of the DRAM device of the preferred embodiment.
Figure 6A:
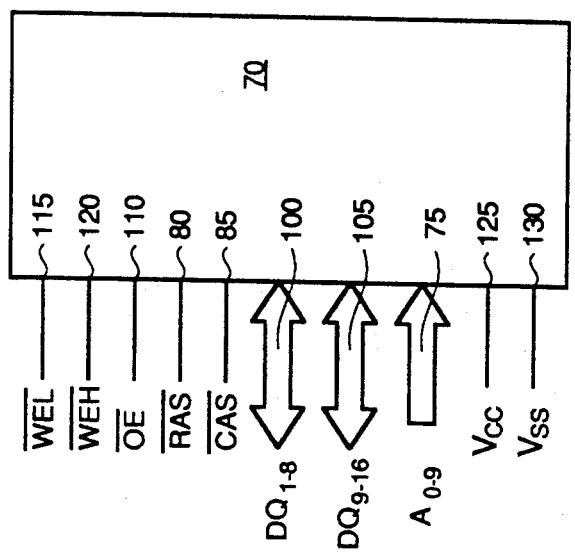
FIG. 6A is a block diagram depicting a DRAM device of the preferred embodiment.

FIG. 6A is a block schematic of the DRAM 70 of the present embodiment. The schematic depicts the control signal inputs, the bidirectional data ports, the unidirectional address port, and inputs for providing electrical coupling to operating potentials. Signals determining the location of the selected memory cells in the 16 memory arrays are accepted at the address port 75. The input signals to the address port are multiplexed and clocked by signals at row address strobe ($\overline{RAS}$) input 80 and column address strobe ($\overline{CAS}$) input 85 to select one 16 bit word from the 256K words available. A $\overline{RAS}$ signal at $\overline{RAS}$ input 80 latches in the row address bits and provides timing constraints for performing circuit operations. A $\overline{RAS}$ signal is used as a strobe to transfer masked data from the data ports to the mask register when either the $\overline{WEL}$ signal, the $\overline{WEH}$ signal, or both $\overline{WEL}$ and $\overline{WEH}$ signals are low prior to $\overline{RAS}$ transitioning low. $\overline{WEL}$ is the lower write enable signal and controls operations pertinent to a lower bank of memory arrays in electrical communication with $DQ_1$ through $DQ_8$, and $\overline{WEH}$ is the upper write enable signal and controls operations pertinent to a upper bank of memory arrays in electrical communication with $DQ_9$ through $DQ_{16}$. A $\overline{CAS}$ signal at $\overline{CAS}$ input 85 latches in the column address bits and strobes the data from and to the data ports. Lower data port 100 accepts data at eight external pins designated $DQ_1$ through $DQ_8$, and upper data port 105 accepts data at eight external pins designated $DQ_9$ through $DQ_{16}$. $DQ_1$ through $DQ_8$ are in electrical communication with memory arrays 1 through 8 respectively, and $DQ_9$ through $DQ_{16}$ are in electrical communication with memory arrays 9 through 16 respectively. In a read cycle the data is driven to the data ports 100 and 105 from the memory cells defined by the address. In a write cycle the data is externally coupled to the data ports 100 and 105 and then coupled from the data ports 100 and 105 to the memory cells defined by the address. An active signal at $\overline{OE}$ input 110 will enable a read operation by enabling output buffers capable of driving data stored in the DQs to the data ports 100 and 105. An inactive signal at the $\overline{OE}$ input 110 insures a high output impedance, z, at the data ports 100 and 105 respectively. Signals at the $\overline{WEL}$ input 115 and $\overline{WEH}$ input 120 provide the circuit with write capabilities and read capabilities in conjunction with an OE signal. In either case $\overline{RAS}$ and $\overline{CAS}$ signals must be active in order to perform the read and write operations. The operating potential at the $V_{cc}$ input 125 is typically +5 volts plus or minus 10 percent and the operating potential at the $V_{ss}$ input 130 is a ground reference potential of 0 volts.

Throughout the remainder of this discussion designations $\overline{RAS}$, $\overline{CAS}$, $\overline{WEL}$, $\overline{WEH}$, $\overline{WE}$ and $\overline{OE}$ will be considered signals unless stated otherwise.

FIG. 6B shows the actual pin configuration of the DRAM 70 of the preferred embodiment. Any figure numbers pertinent to FIG. 6A are pertinent to duplicate components in FIG. 6B. Next to each pin location a number has been written corresponding to the pin number of the pin. The pins are numbered consecutively from 1 through 40. Pins 2 through 5 and 7 through 10 comprise upper data port 100 and pins 31 through 34 and 36 through 39 comprise lower data port 105; pin 12 is the $\overline{WEL}$ input 115, pin 13 is the $\overline{WEH}$ input 120, pin 14 is the $\overline{\text{RAS}}$ input 80 pin 27 is the $\overline{\text{OE}}$ input 110, and pin 28 is the $\overline{\text{CAS}}$ input 85. Pins 16 through 19 and pins 22 through 26 comprise the address port 75. The $V_{cc}$ input 125 is at pins 1, 6 and 20, and the $V_{ss}$ input 130 is at pins 21, 5 and 40.

The preferred embodiment specifies the $\overline{\text{WEL}}$ and $\overline{\text{WEH}}$ input signals as being active low, a low signal enabling a write to memory arrays 1 through 8 and memory arrays 9 through 16 respectively. $\overline{\text{CAS}}$ is active low and the write operation is clocked to the appropriate memory array when $\overline{\text{CAS}}$ is activated. When one or both of $\overline{\text{WEL}}$ and $\overline{\text{WEH}}$ having a low state, $\overline{\text{CAS}}$ transitioning low clocks the data on the data ports to the memory cells of the enabled arrays. When both $\overline{\text{WEL}}$ and $\overline{\text{WEH}}$ go low the device performs a word write and when only one of $\overline{\text{WEL}}$ and $\overline{\text{WEH}}$ goes low a byte write to the selected bank is performed.

$\overline{\text{OE}}$ is active low. An active $\overline{\text{OE}}$ in conjunction with an inactive $\overline{\text{WEL}}$ provides a read to the lower bank, and an active $\overline{\text{OE}}$ in conjunction with an inactive $\overline{\text{WEH}}$ provides a read to the upper bank. Thus one bank may be written while the remaining bank is read; in this case the bank having the active $\overline{\text{WE}}$ is written while the bank having an inactive $\overline{\text{WE}}$ in conjunction with an active $\overline{\text{OE}}$ is read. When both $\overline{\text{WEH}}$ and $\overline{\text{WEL}}$ are inactive (in this case a high) an active signal at $\overline{\text{OE}}$ (in this case a low) enables a word read. $\overline{\text{CAS}}$ is active low and the read operation is clocked to the appropriate DQ when $\overline{\text{CAS}}$ is activated. Both the active $\overline{\text{WE}}$ and $\overline{\text{OE}}$ control signals are preceded by an active $\overline{\text{RAS}}$ signal and are in conjunction with an active $\overline{\text{CAS}}$ signal in order to implement the various combinations of read and write operations. FIG. 7 provides a simplified tabular summary of the operations and control signals effecting the combination of read and write operations of the preferred embodiment. FIG. 7 also provides a tabular summary of the masking options available.

Although the invention is described herein utilizing "early" write and read operations, "late" write and read operations are equally viable. In an "early" write or read operation, the $\overline{\text{WE}}$ is active or the $\overline{\text{OE}}$ is active prior to an active $\overline{\text{CAS}}$ signal. A "late" write operation is characterized as having an active $\overline{\text{CAS}}$ signal prior to the active $\overline{\text{WE}}$ or active $\overline{\text{OE}}$. The data is latched with the falling edge of the latter of the two active signals. For example, in a "late" word write operation, an active $\overline{\text{CAS}}$ is followed by an active $\overline{\text{WEH}}$ latching data to the upper bank and active $\overline{\text{WEL}}$ latching data to the lower bank.

Figure 1:
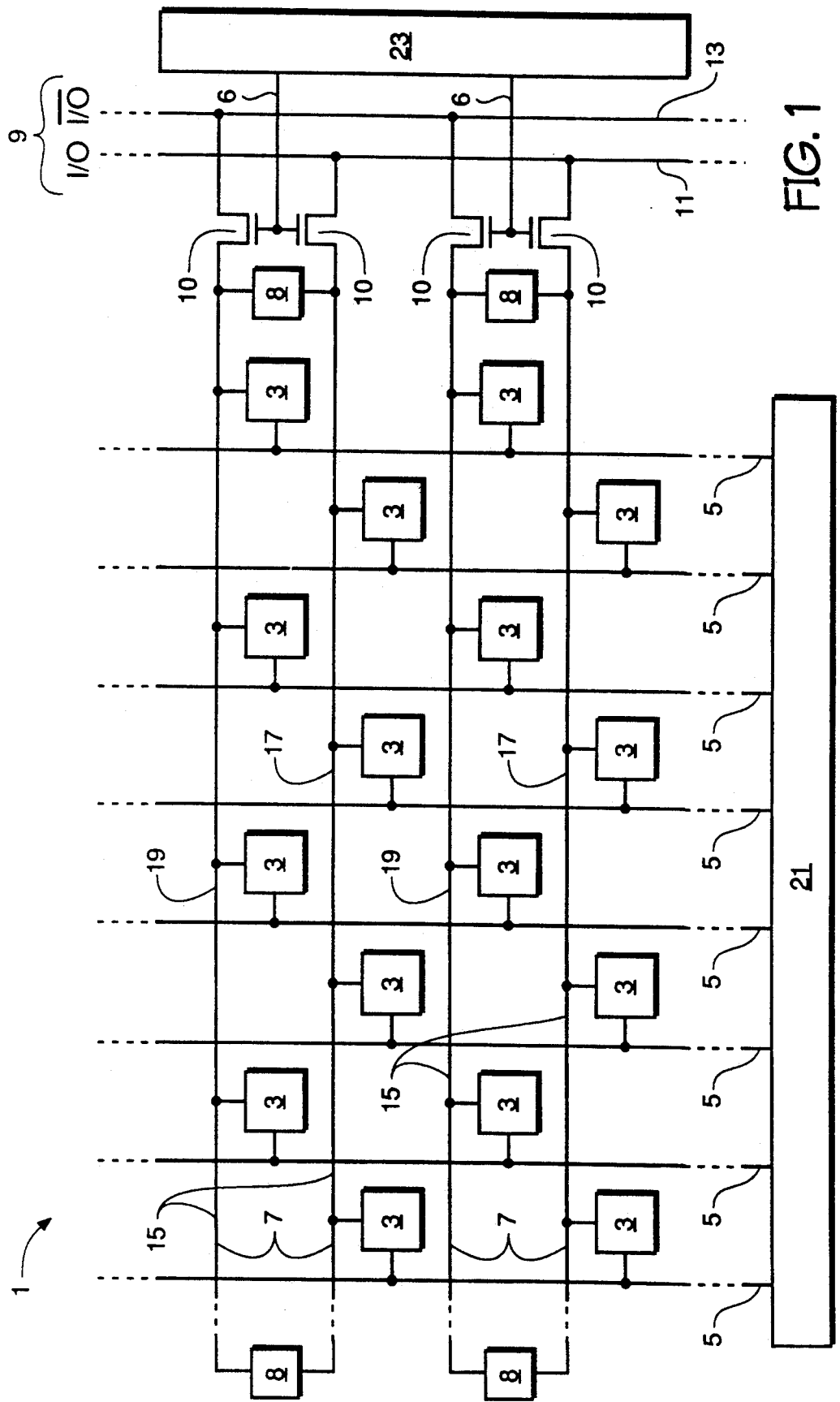
FIG. 1 is a block diagram of a typical DRAM array configuration of the prior art.
Figure 2:
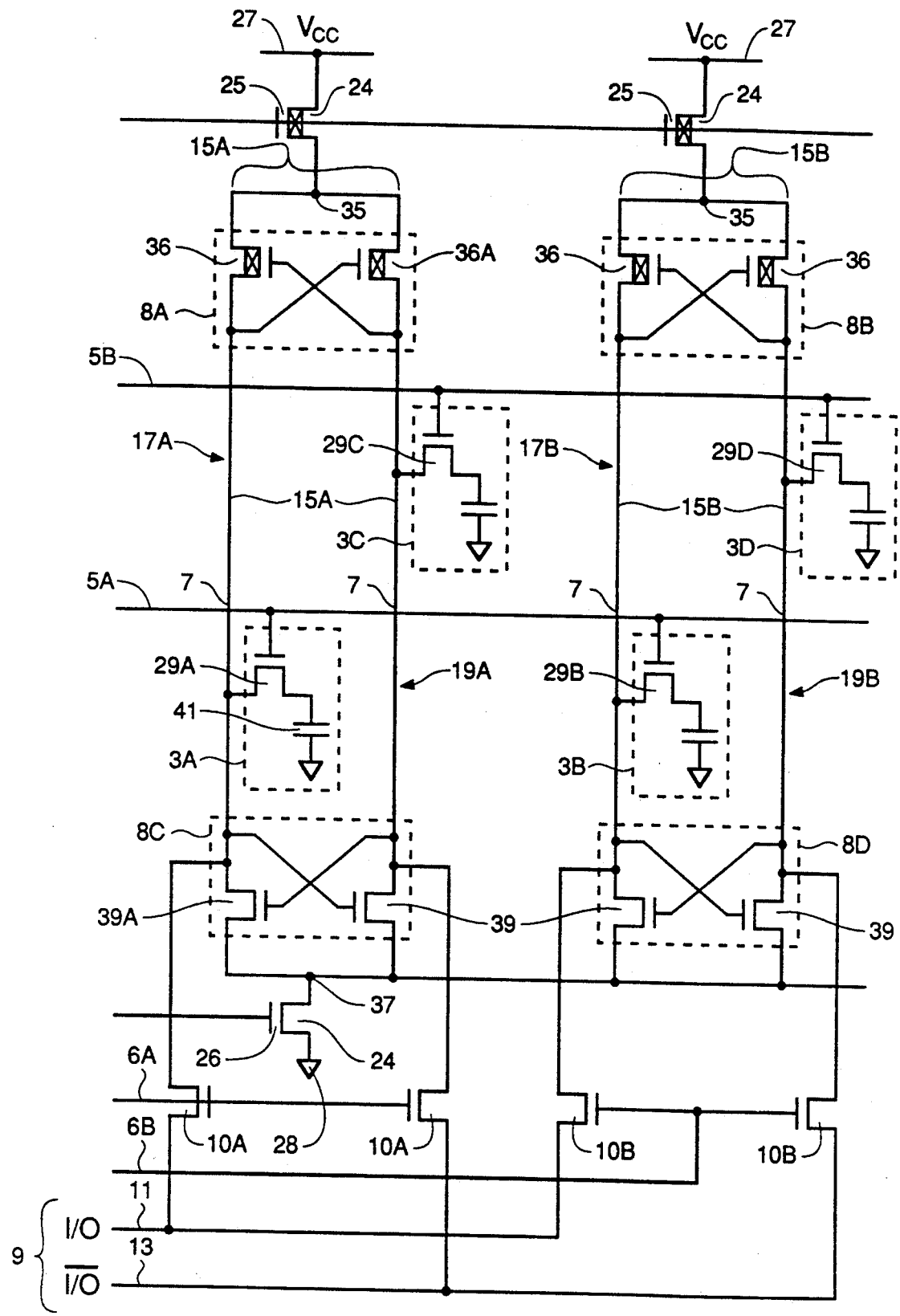
FIG. 2 is a more detailed schematic of a portion of the DRAM array configuration of FIG. 1.
Figure 3:
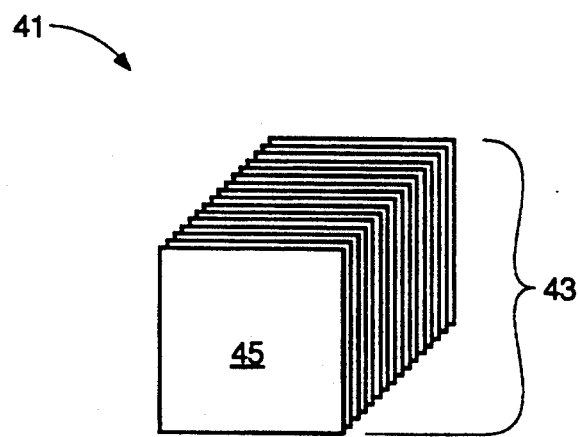
FIG. 3 is a portion of a DRAM of the prior art.
Figure 4:
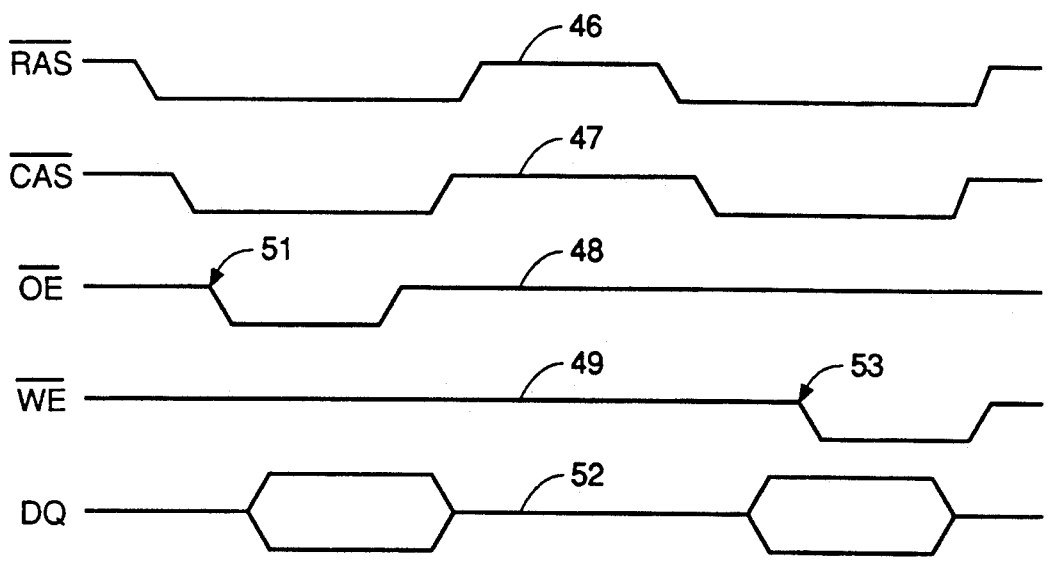
FIG. 4 is a simplified timing diagram depicting read and write cycles of a DRAM of the prior art.
Figure 5:
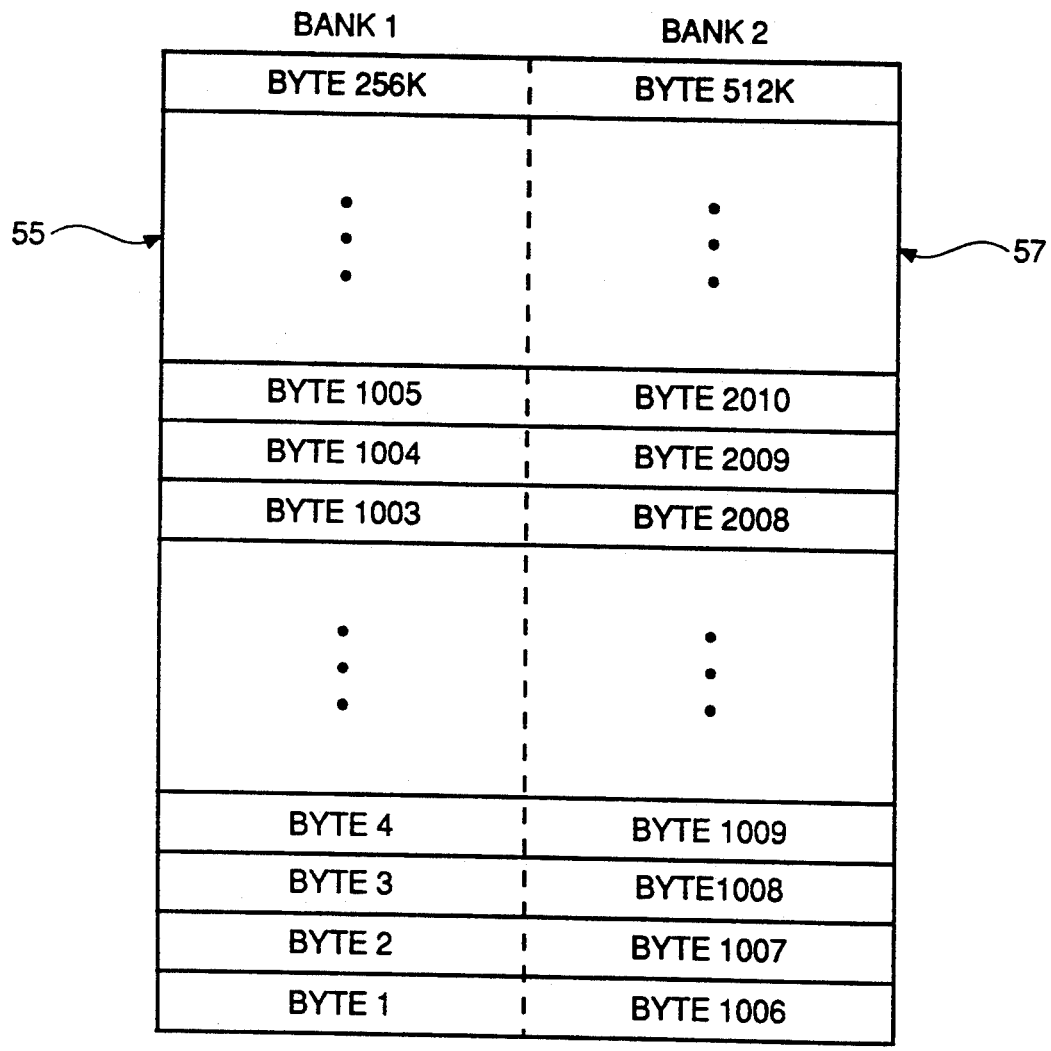
FIG. 5 is a simplified application of the preferred embodiment.
Figure 8:
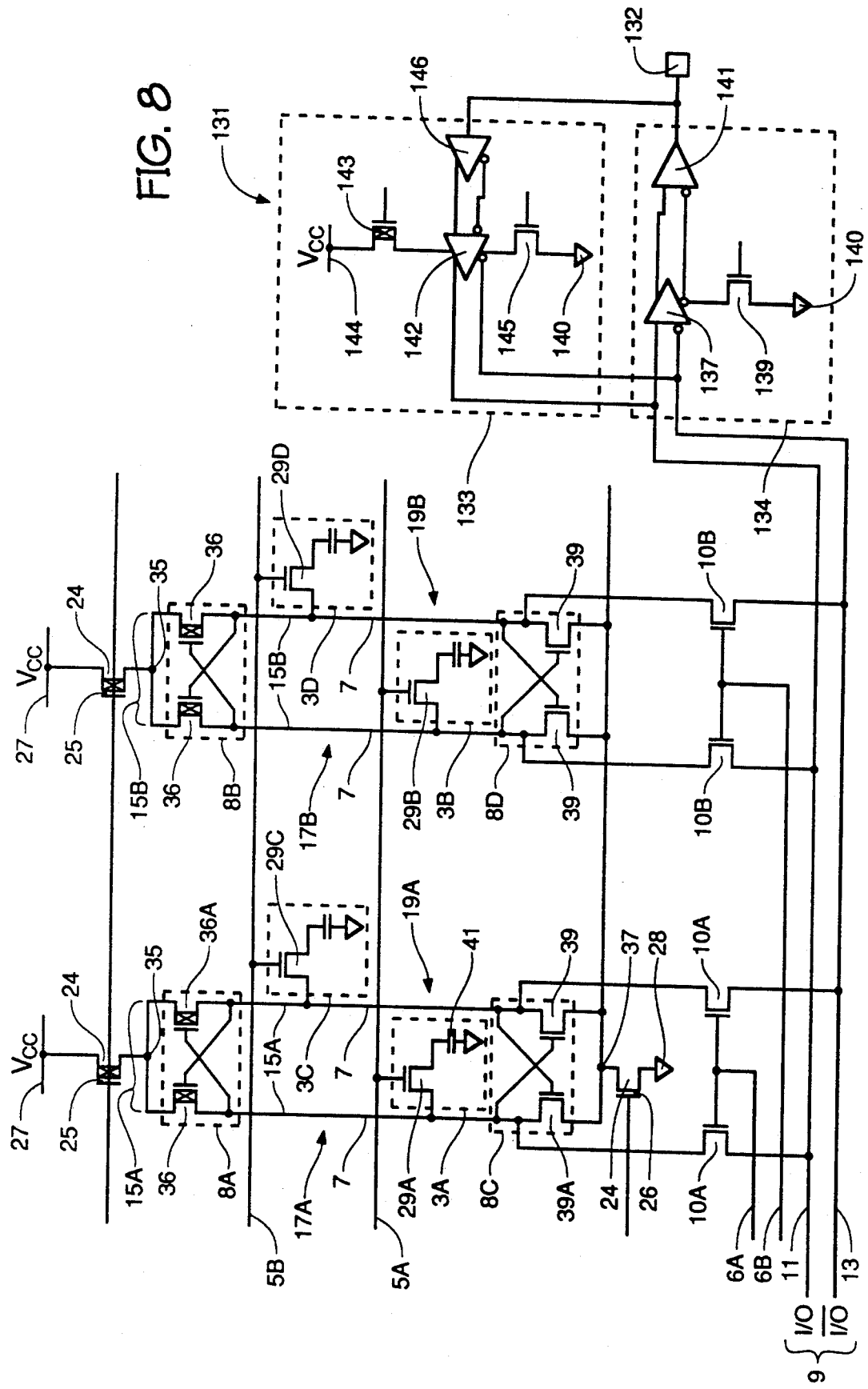
FIG. 8 is a schematic of a portion of the DRAM memory array of the preferred embodiment.

FIG. 8 is a simplified schematic depicting the signal transmission controlling circuit 131 of the invention interposed between digit line pairs 15A and 15B of a memory array and the DQ pin 132 of the array. Any figure numbers pertinent to FIG. 2 are pertinent to duplicate components in FIG. 8. The signal transmission controlling circuit 131 comprises two sections, a write section 133 and a read section 134. The two sections are connected in parallel such that if one section is disabled the remaining section is enabled. Each section is interposed between the I/O lines 11 and 13 and the DQ pin 132. A DC sense amplifier 137 in the read section is coupled to the I/O lines 11 and 13 and is enabled by activating a MOSFET switch 139 interposed between the DC sense amplifier 137 and ground 140. The activation of the MOSFET switch occurs in response to a read instruction. The DC sense amplifier 137 is electrically coupled to an output buffer 141, the output of which is the DQ pin 132. A write driver 142 in the write section is coupled to the I/O lines 11 and 13 and is enabled by activating a p MOSFET switch 143 interposed between the write driver 142 and $V_{cc}$ 144 and activating an n MOSFET switch 145 interposed between the write driver 142 and ground 140. The activation of the MOSFET switches 143 and 145 occurs in response to a write instruction. The write driver is electrically coupled to an input buffer 146, the input of which is the DQ pin 132.

During a read operation the DC sense amplifier 137 is enabled and the write driver is disabled. The I/O signal and the I/O complement signal are the input signals to the DC sense amplifier 137. The DC sense amplifier 137 senses the relative voltages of the I/O signals and amplifies the signals. The amplified signals are coupled to the output buffer 141. The output buffer 141 transfers the correct data information to the DQ pin 132 while providing current gain for driving external capacitances.

During a write operation the write driver 142 is enabled and the DC sense amplifier 137 is disabled. The input buffer 146 transfers the data information from the DQ pin 132 to the enabled write driver 142 which in turn drives the data and its complement to the I/O line 11 and I/O complement line 13 respectively for storage in the selected cell. The input buffer 146 is a low power device having low input capacitance while providing voltage translation of an input signal. During voltage translation a signal falling within the high or low voltage specification of the DRAM will be driven to the full voltage value of 5 volts or 0 volts.

The parallel read and write sections of the signal transmission controlling circuit 131 allow the split read/write operation of the invention. Since each array is connected utilizing the parallel configured read and write sections, read sections 134 may be enabled for one bank while write sections 133 are enabled for the remaining bank. Similarly, the write sections in both banks may be enabled for a word write and the read sections in both banks may be enabled for a word read. In the case of a byte write, the write section is enabled in the arrays comprising the bank to be written and the remaining bank is refreshed. In a byte read, the arrays are enabled as though a split read/write were to be performed. However, all of the DQs in the bank to be written are masked. Alternately, the byte read may be performed by enabling the arrays for a word read and masking all of the DQs in one bank.

Figure 9:
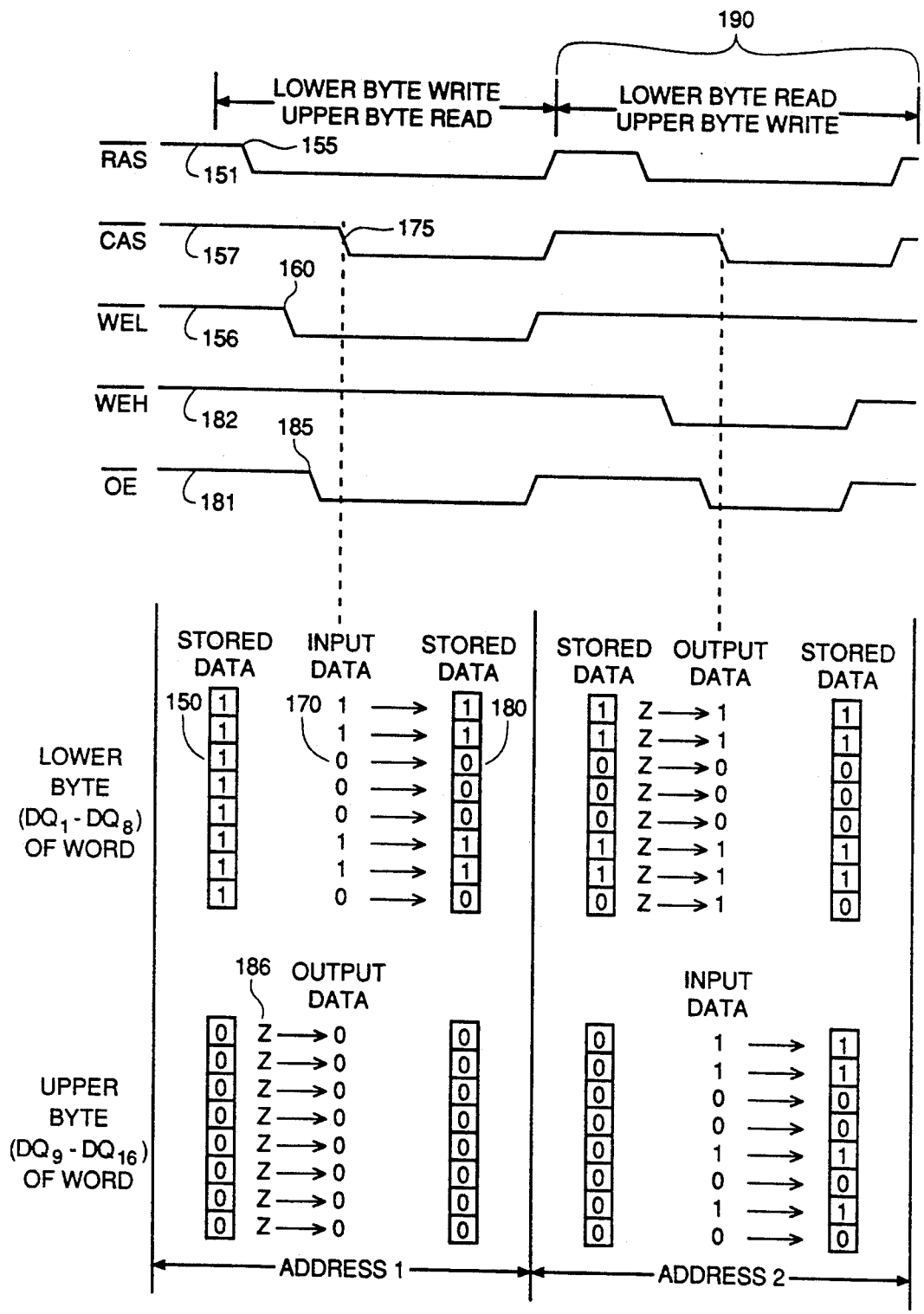
FIGS. 9 through 11 are timing diagrams pertinent to the control signals of the preferred embodiment. Specific examples of data stored in the memory arrays and logic states available at the DQ pins are shown columnized in relation to the timing diagram.
Figure 10:
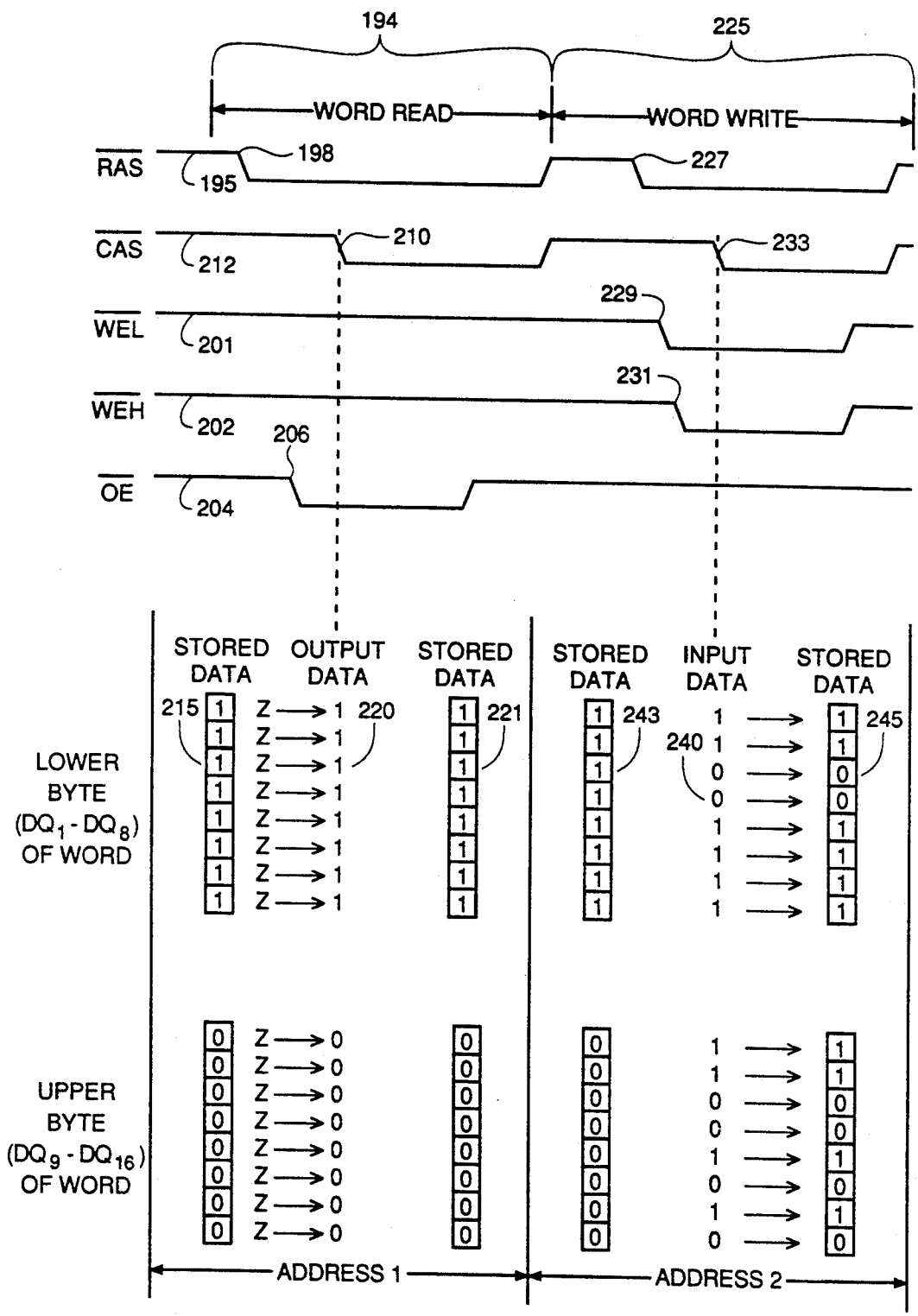
Figure 11:
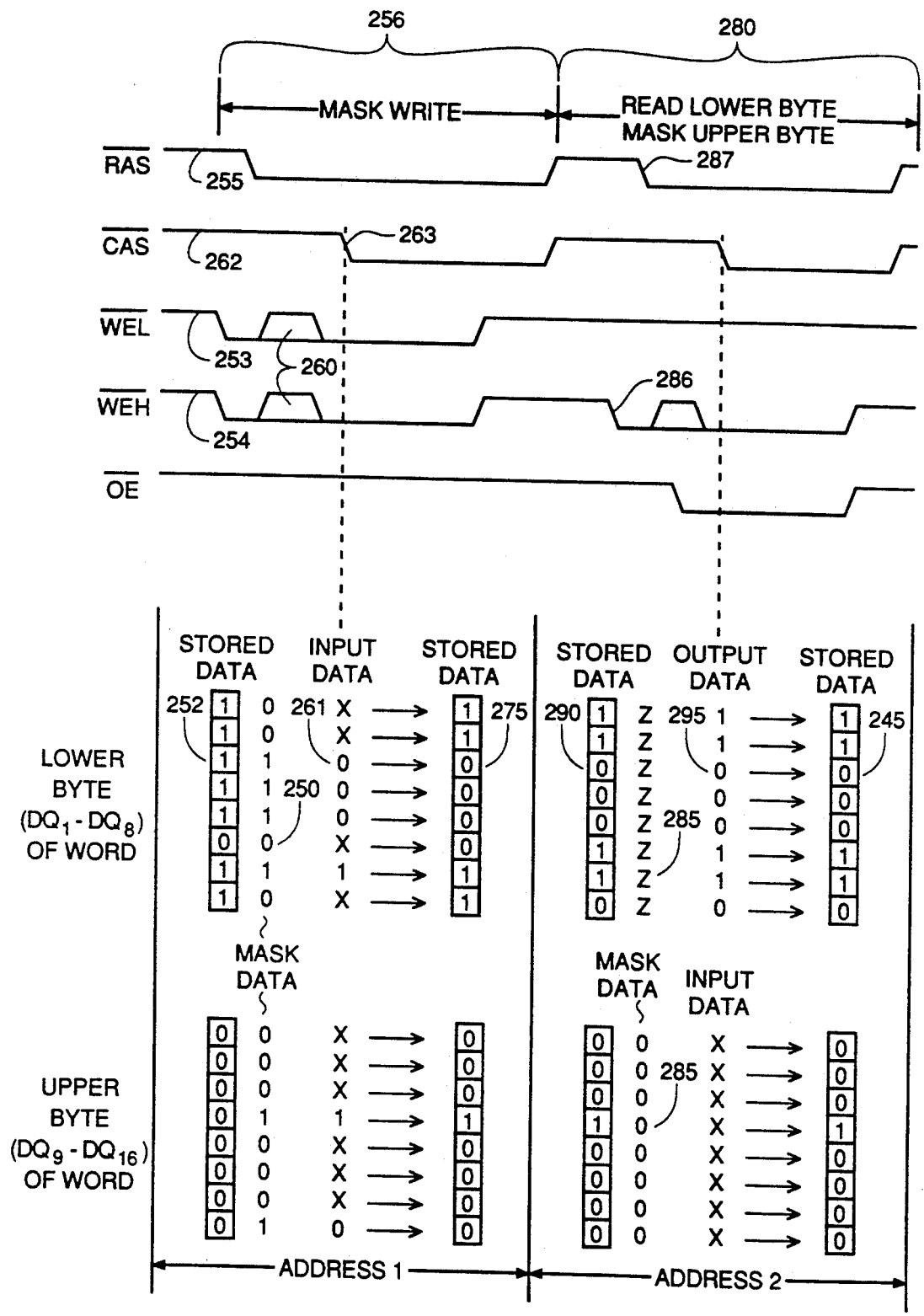

Examples of a word write, a word read, mask writes, a byte read, and split read/writes are described in FIGS. 9 through 11. In FIGS. 9 through 11 data stored in the memory cells and data accepted at the data ports are shown relative to sample control signals. The potentials of the control signals are depicted in timing diagram format. The potentials are vertically expressed and can be thought of as high and low voltages. Time is horizontally expressed. The logic states available at the data ports and the logic states of the addressed memory cells have been columnized below the timing diagram to facilitate an analysis of the preferred embodiment. The logic state specified in the boxes represents the value of the data stored in the addressed memory cells. Each figure depicts control signals for two operational cycles, each cycle having a specific address for selecting the memory cells to be written or read, labeled address 1 and address 2. The logic states not in boxes represent the logic states of the DQs of the data ports. The memory arrays and their corresponding DQs are numbered consecutively 1 to 16 from top to bottom. The logic state specified in each column of the example represents the logic state in either the memory cell of the selected array or the logic state of the DQ at the same time reference as the control signals directly and vertically above the column.

A split read/write is depicted in FIG. 9. The data initially stored in the addressed memory cells is displayed in column 150. $\overline{RAS}$ 151 transitioning low at 155 followed by $\overline{WEL}$ 156 transitioning low at 160 allows the input data, shown in column 170 and available at the lower data port, to overwrite the data shown in column 150 when $\overline{CAS}$ 174 transitions low at 175. The newly stored data is displayed in column 180. The logic circuitry of the preferred embodiment enables the output buffers for the upper banks when $\overline{OE}$ 181 goes low at 185 and WEH 186 is high. Therefore, the data stored in memory arrays 9 through 16 is transmitted to the upper data port, shown in column 170, and the originally stored data is retained in the memory arrays, shown in column 180. Thus, in the example the lower bank was written as the upper bank was read. Prior to point 185 of the timing diagram both $\overline{WEH}$ 186 and $\overline{OE}$ 181 were high and the output buffer provided a high impedance at the upper date port, shown in column 186.

The next timing sequence 190 just reverses the process and the lower bank is read and the upper bank is written.

FIG. 10 depicts examples of a word read and a word write. Section 194 of the example depicts a word read. $\overline{RAS}$ 195 transitions low at 198. Both $\overline{WEL}$ 201 and $\overline{WEH}$ 202 remain high while $\overline{OE}$ 204 transitions low at 206. At point 210 $\overline{CAS}$ 212 clocks the data stored in the selected memory cells, shown in column 215, to the upper and lower data ports, shown in column 220. The data stored in the memory remains unchanged during a read operation and is shown subsequent to the read operation in column 221.

Section 225 of the timing diagram is an example of a word write. Again $\overline{RAS}$ 195 is the first to transition low at 227 followed by $\overline{WEL}$ 201 and $\overline{WEH}$ 202 at 229 and 231 respectively. $\overline{OE}$ 204 remains high. The logic circuit of the preferred embodiment is designed such that either $\overline{WEL}$ 201, $\overline{WEH}$ 202, and $\overline{OE}$ 204 cannot be low simultaneously, or when $\overline{WEL}$ 201 and $\overline{WEH}$ 202 are both low, $\overline{OE}$ 204 is ignored. $\overline{CAS}$ transitioning low at 233 clocks the input data (shown in column 240) on the upper and lower data ports to the selected memory cells, overwriting the data originally stored in the selected memory cells, shown in column 243. The data in column 245 is the data stored in the selected memory cells subsequent to the word write.

Thus, the logic circuitry of the preferred embodiment allows a word read when $\overline{RAS}$ transitions low followed by both $\overline{WEL}$ and $\overline{WEH}$ transitioning or remaining high and $\overline{OE}$ and $\overline{CAS}$ transitioning low. The logic circuitry of the preferred embodiment allows the standby condition where $\overline{WEL}$, $\overline{WEH}$, and $\overline{OE}$ are high simultaneously or, if $\overline{CAS}$ is also high it allows a $\overline{RAS}$ only refresh. Although neither a read nor write operation will be performed, a high impedance is provided at the data ports. If only $\overline{OE}$ and one of $\overline{WEL}$ and $\overline{WEH}$ are high, the data ports having the high $\overline{WE}$ will have a high impedance. A word write is performed when $\overline{RAS}$ transitions low followed by $\overline{WEL}$, $\overline{WEH}$ and $\overline{CAS}$ transitioning low. With the exception of the added byte read and split read/write functions, the circuitry of the preferred embodiment operates identically to a conventional two $\overline{WE}$ DRAM.

Although a high impedance is preferred at the data port when neither a read nor write is performed, any nonresponsive signal condition is viable. For example, the data ports could be shunted to ground.

In the previous examples a write or read instruction was precipitated by $\overline{RAS}$ transitioning low before $\overline{WEL}$, $\overline{WEH}$, $\overline{CAS}$, or $\overline{OE}$. In order to mask one or more DQs the DRAM receives a mask instruction which is precipitated by $\overline{WEL}$, $\overline{WEH}$ or both $\overline{WEL}$ and $\overline{WEH}$ transitioning low prior to $\overline{RAS}$ transitioning low. Upon receiving the mask instruction the DRAM enables a mask register. The mask register masks DQs in both banks if both $\overline{WEL}$ and $\overline{WEH}$ are activated before $\overline{RAS}$ is activated. If only one $\overline{WE}$ is activated prior to $\overline{RAS}$ being activated, only DQs in that bank are masked. During a masked write mask data is supplied on the DQ pins for each bank enabled for the mask write. The mask data acts as individual write enables for each DQ. If a low is written to a mask data register bit, the input port for that bit is disabled during the following write operation and no new data will be written to that DRAM cell location. A high (logic 1) on a mask data resister bit enables the input port and allows normal write operations to proceed.

FIG. 11 depicts examples pertinent to masking DQs in bother upper and lower DQs. The mask data in column 250 is available at both the lower and upper data ports since $\overline{WEL}$ 253 and $\overline{WEH}$ 254 transition low prior to $\overline{RAS}$ 255 transitioning low at 256. A low on a data port pin disables that data port pin for a write. In the example lows on pins 2, 3, 8, 10, 31 through 33, and 36 through 38 (FIG. 6B) mask DQs 1, 2, 6, 8, 9, 10, 11, 13, 14, and 15 for the write operation to both banks. Once the mask data has been latched into the mask register, $\overline{WEL}$ 253 and $\overline{WEH}$ 254 may remain low or transition high shown by the don't care condition 260. However, in order to initiate the write cycle, WEL 253 and WEH 254 must transition low prior to $\overline{CAS}$ clocking low. The input data, shown in column 261, needs to be available on the data ports prior to $\overline{CAS}$ 262 clocking in the write operation when it transitions low at 263. DQs 1, 2, 6, 8, 9, 10, 11, 13, 14, and 15 retain the original data shown in column 252. DQs 3, 4, 5, 7, 12, and 16 store the data available at the data ports, shown in column 261. The letter X indicates a don't care condition because data on these pins is irrelevant since they have been masked. DQs 3, 4, 5, 7, 12, and 16 are written to when $\overline{CAS}$ transitions low at 263. The final logic state stored in the memory arrays is shown in column 275.

Section 280 is an example of a byte read. The byte read is accomplished by masking one byte in its entirety for a write and then performing a split read/write cycle to produce a read in the remaining byte. In the present example the entire upper bank is masked by the low mask data available at the upper data port and shown in column 285. $\overline{WEH}$ transitioning low at 286 before $\overline{RAS}$ transitions low at 287 initiates the mask write instruction to the mask register of the upper byte. The output on the data port of the lower bank remains at a high impedance. Since the data stored in the upper bank and shown in column 290 has been masked, the data stored in the upper bank remains unchanged during the read of the lower bank even though $\overline{WEH}$ is low. The data stored in the lower bank, shown in column 290, is read at the data port as shown in column 295.

The preferred embodiment is a method for implementing the following combinations of read and write operations in a two bank, wide word DRAM having two $\overline{WE}$, $\overline{WEH}$, and $\overline{WEL}$ inputs comprising initiating a read and/or write with an active $\overline{RAS}$ and clocking the read and/or write operations with an active $\overline{CAS}$. The following operations are implemented prior to activating $\overline{CAS}$ in order to determine the appropriate read and write for $\overline{CAS}$ to clock. The first operation, a read of one bank and a simultaneous write of the other bank, comprises activating the $\overline{WE}$ controlling the bank to be written and activating $\overline{OE}$ while retaining an inactive $\overline{WE}$ for the bank to be read. The activated $\overline{OE}$ enables the output buffer for the bank to be read. A second operation, only writing data to one of the two banks, comprises activating the $\overline{WE}$ controlling the bank to be written. The remaining $\overline{WE}$ and the $\overline{OE}$ being inactive, an inactive $\overline{OE}$ in conjunction with an inactive $\overline{WE}$ provides a high impedance output at the data ports of the bank not being written. A third operation, writing to both banks, comprises activating both $\overline{WEL}$ and $\overline{WEH}$ while retaining an inactive $\overline{OE}$. A fourth operation, reading data from both banks, comprises retaining inactive $\overline{WEH}$ and $\overline{WEL}$ while activating $\overline{OE}$. A fifth operation, reading data from one bank, comprises masking all of the DQs for a write to the bank that is not read while retaining an inactive $\overline{WE}$ for the bank to be read while $\overline{OE}$ is activated. The invention implements masking of individual DQs for any of the aforementioned write operations. The masking comprises activating the $\overline{WE}$ pertinent to the bank in which DQs selected for masking are located prior to activating $\overline{RAS}$. This timing sequence enables a mask register. Mask data available at the data port determines which DQs are masked. Either one or both $\overline{WE}$s may be activated for masking individual DQs. Once the DQs have been masked one of the aforementioned write operations is implemented.

During either a word write or a byte write operation of the invention the following steps are performed in the banks or bank to which data is to be written. The digit line equilibration circuits are disabled, and the row line indigenous to the selected cell is activated. Since the digit lines are no longer equilibrated the charge stored in the selected cell is transferred to the digit lines. Next the n sense amplifiers actuate, and the I/O line equilibrate circuits are disabled. Next the write drivers are enabled. The column decoder access device turns on allowing the digit lines and cells to be overwritten by the enabled write drivers. Finally, the p sense amplifiers are turned on to allow a full high level to be written to the selected cell.

Due to parasitic capacitance leakage, the memory cells must be refreshed periodically to keep the storage capacitors charged or discharged and to ensure memory preservation. A refresh cycle normally involves cycling through the memory and performing a read/write operation in each location of the memory in turn during a power down mode. In the invention if the operation is a byte write only, the inactive bank, the bank not being written, undergoes a refresh cycle wherein the steps specified for the write operations are altered by eliminating the enabling of the write driver.

The preferred embodiment also provides word read and byte read capabilities. The read cycle is a modification of a write cycle. The modification comprises activating the p sense amplifiers just after the activation of the n sense amplifiers. The write drivers must also be disabled. After the column access device is enabled, DC sense amplifiers are enabled and the DC sense amplifier equilibrate circuit is released or disabled. Finally, the output buffer must be enabled. During a byte read the method remains the same for the bank to be read. However, a mask write of the entire opposite bank is performed.

During a split read/write the preferred embodiment utilizes the read operation to read from one bank while utilizing the write operation to write to the opposite bank, both operations performed according to the preceding descriptions.

In a second embodiment of the invention the arrays may be arranged into more than two banks, each bank controlled by an individual $\overline{WE}$ signal. The basic timing concepts and control signals of the preferred embodiment are employed to implement the second embodiment. In the second embodiment various combinations of split read/writes can be implemented. Selected writes or selected reads of various banks may also be implemented resulting in a write only operation to at least one bank or a read only operation to at least one bank respectively. For example, a sixteen array memory may be divided into four banks. In this case there are four $\overline{WE}$ signals, one for each bank. The following combinations of operations comprise some of the operations possible in the four bank memory array. The split read/write operation could comprise three banks being read while one is written or three banks being written while one is read. A write only operation could comprise one bank being written while three banks are refreshed or three banks being written while one is refreshed. The read only operation could comprise one or three banks being read.

An option when utilizing a separate $\overline{OE}$ input for each bank of the plurality allows banks not being read during a split read/write or byte read operation of the second embodiment to be refreshed without requiring a masked write to that respective bank.

Another option for performing a read only operation or a split read/write operation utilizes a single $\overline{OE}$ input and a mask write in the banks not being read. In the read only operation the banks not being read are masked in their entirety, and in the case of the split read/write operation the banks not being read may be either masked in their entirety or masked for individual DQs and written to the unmasked DQs.

Although the preferred embodiment provides for masking of data to be written, the invention may be modified to include masking of data to be read without detracting from the spirit and scope of the invention. The masking of a read operation is accomplished using a mask register for read. The mask register for read controls the output buffers, deactivating them for DQs being masked.

The basic operations of the invention (a split read/write, a word write, a byte write, a word read, a byte read and a masked write of the individual DQ) can also be implemented using timing sequences and logic conditions other than those herein stated, the actual implementation is not critical to the concept of the invention. Thus, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

What is claimed is:

1. A method for performing operations in a monolithic memory device having a plurality of circuit banks of memory cells, the method comprising the following steps:

a) writing first data to at least one of said plurality of circuit banks;

b) reading second data from at least one of said plurality of circuit banks; and c) reading from at least one of said plurality of circuit banks while substantially simultaneously writing to at least one of said plurality of circuit banks and communicating said first and second data to and from said plurality of circuit banks through an external port in a single memory cycle.

2. The method of claim 1, further comprising masking said at least one of said circuit banks being written.

3. The method of claim 1, further comprising masking at least one of said circuit banks during said reading.

4. The method of claim 1, further comprising refreshing at least one circuit bank.

5. A method for performing a write operation to a first bank of memory cells of a monolithic memory chip and for performing a read operation to a second bank of memory cells of the monolithic memory chip in a single memory cycle, comprising:

a) disabling digit lien equilibration circuitry in said first bank and disabling digit line equilibration circuitry in said second bank;

b) selecting a memory cell in said first bank and selecting a memory cell in said second bank;

c) activating a row line coupled to said selected memory cell in said first bank and activating a row line coupled to said selected memory cell in said second bank;

d) transferring charge stored in said selected memory cell to digit lines in said first bank and transferring charge stored in said selected memory cells to digit lines in said second bank;

e) activating an n sense amplifier in order to amplify said charge transferred to said digit lines in said first bank and activating an n sense amplifier in order to amplify said charge transferred to said digit lines in said second bank;

f) disabling Input/Output line equilibrate circuitry in said first bank;

g) activating a write diver in said first bank;

h) activating a column decoder access device, said activating allowing said write driver to overwrite said charge on said digit lines in said first bank;

i) activating a p sense amplifier for amplifying data to be written to said selected memory cells in said first bank;

j) activating a p sense amplifier in said second bank;

k) disabling a write driver in said second bank;

l) activating said DC sense amplifier in said second bank;

m) activating a column decoder access device in said second bank;

n) disabling equilibrate circuitry to a DC sense amplifier in said second bank; and o) enabling an output buffer to allow said amplified charge to be driven from said digit lines to an output pin through said DC sense amplifier in said second bank.

6. The method of claim 19, wherein said step of refreshing comprises:

a) disabling digit lien equilibration circuitry;

selecting a memory cell for refresh in said second memory bank;

c) activating a row line coupled to said selected memory cell;

d) transferring charge stored in said selected memory cell to digit lines;

e) activating an n sense amplifier in order to amplify said charge transferred to said digit lines;

f) disabling Input/Output line equilibrate circuitry; and g) activating a p sense amplifier for amplifying data written to said selected memory cell.

7. A method for performing memory operations in a single memory cycle in a monolithic random access memory device having a first bank and a second bank, comprising the following steps:

a) providing a first write enable signal;

b) providing a second write enable signal;

c) providing an output enable signal;

d) writing to the first bank when the first write enable signal is active;

e) writing to the second bank when the second write enable signal is active;

f) reading from the first bank when the first write enable signal is inactive and the output enable signal is active; and g) reading from the second bank when the second write enable signal is inactive and the output enable signal is active, wherein the method allows said output enable signal to be active when one of said first and said second write enable signals are active.

8. The method as specified in claim 7, further comprising writing to one of the first and the second banks while reading from a remaining one of the first and the second banks.

9. The method as specified in claim 7, further comprising writing to the first and the second banks.

10. The method as specified in claim 7, further comprising reading to the first and the second banks.

11. The method as specified in claim 7, further comprising:

a) transitioning a row address strobe signal to an active value prior to providing said active first write enable signal, prior to providing said active second write enable signal, and prior to providing said active output enable signal; and b) transitioning a column address strobe signal to an active value in order to provide clocking of the memory operations in said first and said second banks.

12. The method as specified in claim 7, further comprising:

a) selecting a memory cell in said first bank upon which to perform the memory operation; and b) selecting a memory cell in said second bank upon which to perform the memory operation.

13. The method as specified in claim 7, further comprising masking said step of writing to a least one memory cell, said masking inhibiting said step of writing to said one memory cell.

14. The method as specified in claim 13, further comprising masking said step of writing to at least one of said first and second banks in its entirety.

15. The method as specified in claim 14, further comprising reading from an unmasked bank during said step of masking.

16. The method as specified in claim 13, wherein said masking comprises transitioning a row address strobe signal to an active value subsequent to at least one of said first and second write enable signals having an active value.

17. The method as specified in claim 13, wherein said masking further comprises providing mask data to an internal and electrically integrated mask register in said dynamic random access memory.

18. The method as specified in claim 7, further comprising:
 a) enabling one of the first and the second banks for said step of reading;
 b) enabling the remaining one of the first and the second banks for said step of writing; and
 c) masking the step of writing to at least a portion of the bank being written.

19. A method for performing a memory operation in a single memory cycle in a monolithic memory chip having a first memory bank and a second memory bank, comprising:
 a) writing input data to said first memory bank from an output port;
 b) substantially simultaneously reading output data from said second memory bank at said output port; and
 c) refreshing stored data in a memory of said second memory bank.

* * * * *